United States Patent
Moon et al.

(10) Patent No.: US 9,147,724 B2
(45) Date of Patent: Sep. 29, 2015

(54) LARGE AREA ORGANIC LIGHT EMITTING DIODE DISPLAY

(71) Applicant: LG Display Co., Ltd., Seoul (KR)

(72) Inventors: Jinyoung Moon, Seoul (KR); Samyul Boo, Seoul (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 14/552,766

(22) Filed: Nov. 25, 2014

(65) Prior Publication Data

US 2015/0144922 A1   May 28, 2015

(30) Foreign Application Priority Data

Nov. 28, 2013   (KR) .......................... 10-2013-0145839

(51) Int. Cl.
*H01L 27/32*   (2006.01)
*H01L 51/52*   (2006.01)

(52) U.S. Cl.
CPC ........ *H01L 27/3279* (2013.01); *H01L 51/5228* (2013.01)

(58) Field of Classification Search
None
See application file for complete search history.

(56) References Cited

U.S. PATENT DOCUMENTS

| | | | |
|---|---|---|---|
| 2005/0078252 A1* | 4/2005 | Lin | 349/139 |
| 2006/0113900 A1* | 6/2006 | Oh | 313/504 |
| 2007/0194699 A1* | 8/2007 | Lee et al. | 313/505 |
| 2013/0069853 A1* | 3/2013 | Choi | 345/80 |

* cited by examiner

*Primary Examiner* — Charles Garber
*Assistant Examiner* — Alia Sabur
(74) *Attorney, Agent, or Firm* — Morgan, Lewis & Bockius LLP

(57) ABSTRACT

A large area organic light emitting diode display is provided. The organic light emitting diode display comprises a substrate including a display area defining a plurality of pixel areas in a matrix manner and a non-display area surrounding the display area; a thin film transistor disposed in each pixel area; an auxiliary cathode electrode disposed at the same layer with an element of the thin film transistor; a planar layer on the thin film transistor and the auxiliary cathode electrode; an anode electrode connected to the thin film transistor and disposed in each pixel area on the planar layer; an organic light emission layer disposed on the anode electrode; a cathode electrode covering the whole surface of the display area on the organic light emission layer; and a protective electrode covering the auxiliary cathode electrode exposed through a cathode contact hole and contacting the cathode electrode.

7 Claims, 8 Drawing Sheets

LARGE AREA ORGANIC LIGHT EMITTING DIODE DISPLAY

This application claims the benefit of Korea Patent Application No. 10-2013-0145839 filed on Nov. 28, 2013, which is incorporated herein by reference for all purposes as if fully set forth herein.

BACKGROUND OF THE INVENTION

1. Field of the Invention

The present disclosure relates to a large area organic light emitting diode display, and more particularly, to an organic light emitting diode display having an auxiliary cathode electrode for lowering the surface resistance of the cathode electrode and a protective electrode for preventing the auxiliary cathode electrode.

2. Discussion of the Related Art

Nowadays, various flat panel display devices are developed for overcoming many drawbacks of the cathode ray tube such as heavy weight and bulk volume. The flat panel display devices include the liquid crystal display device (or LCD), the field emission display (or FED), the plasma display panel (or PDP) and the electroluminescence device (or EL).

FIG. 1 is a plane view illustrating the structure of the organic light emitting diode display having the active switching elements such as the thin film transistors according to the related art. FIG. 2 is a cross sectional view illustrating the structure of the organic light emitting diode display along to the cutting line of I-I' in FIG. 1 according to the related art.

Referring to FIGS. 1 and 2, the organic light emitting diode display comprises a thin film transistor (or 'TFT') substrate having the thin film transistors ST and DT and an organic light emitting diode OD connected to and driven by the thin film transistors ST and DT, and a cap ENC joining and facing the TFT substrate with an organic adhesive POLY therebetween. The TFT substrate includes a switching thin film transistor ST, a driving thin film transistor DT connected to the switching thin film transistor ST, and an organic light emitting diode OD connected to the driving thin film transistor DT.

On a transparent substrate SUB, the switching thin film transistor ST is formed where a gate line GL and a data line DL are crossing each other. The switching thin film transistor ST acts for selecting the pixel which is connected to the switching thin film transistor ST. The switching thin film transistor ST includes a gate electrode SG branching from the gate line GL, a semiconductor channel layer SA overlapping with the gate electrode SG, a source electrode SS and a drain electrode SD. The driving thin film transistor DT acts for driving an anode electrode ANO of the organic light emitting diode OD disposed at the pixel selected by the switching thin film transistor ST. The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OD.

As one example, FIG. 2 shows the thin film transistor of top gate structure. In this case, the semiconductor channel layers SA and DA of the switching thin film transistor ST and the driving thin film transistor DT are firstly formed on the substrate SUB and the gate insulating layer GI covers them and then the gate electrodes SG and DG are formed thereon by overlapping with the center portion of the semiconductor channel layers SA and DA. After that, at both sides of the semiconductor channel layers SA and DA, the source electrodes SS and DS and the drain electrodes SD and DD are connected thereto through contact holes penetrating an insulating layer IN. The source electrodes SS and DS and the drain electrodes SD and DD are formed on the insulating layer IN.

In addition, at the outer area surrounding the display area where the pixel area is disposed, a gate pad GP formed at one end of the gate line GL, a data pad DP formed at one end of the data line DL, and a driving current pad VDP formed at one end of the driving current line VDD are arrayed. A passivation layer PAS is disposed to cover the upper whole surface of the substrate SUB having the switching and the driving thin film transistors ST and DT. After that, formed are the contact holes exposing the gate pad GP, the data pad DP, the driving current pad VDP and the drain electrode DD of the driving thin film transistor DD. Over the display area within the substrate SUB, a planar layer PL is coated. The planar layer PL makes the roughness of the upper surface of the substrate SUB in much smoother condition, for coating the organic materials composing the organic light emitting diode on the smooth and planar surface condition of the substrate SUB.

On the planar layer PL, the anode electrode ANO is formed to connect the drain electrode DD of the driving thin film transistor DT through one of the contact holes. On the other hands, at the outer area of the display area not having the planar layer PL, formed are a gate pad electrode GPT, a data pad electrode DPT and a driving current electrode VDPT connected to the gate pad GP, the data pad DP and the driving current pad VDP, respectively, exposed through the contact holes. On the substrate SUB, a bank BA is formed covering the display area, excepting the pixel area.

On the bank BA and the exposed anode electrode ANO by the bank BA, an organic light emission layer OL is stacked. Then, on the organic light emission layer OL, a cathode electrode CAT is deposited. As a result, an organic light emitting diode OLED having the stacked structure of the anode electrode ANO, the organic light emission layer OL and the cathode electrode CAT is completed.

A cap TS is joining the thin film transistor substrate having above mentioned structure with the constant gap therebetween. In that case, it is preferable that the thin film transistor substrate and the cap TS are completely sealed by having an organic adhesive FS between them. The organic adhesive FS prevents moisture and gases from intruding into the inner space of the thin film transistor substrate. The gate pad electrode GPT and the data pad electrode DPT exposing to the exterior of the cap ENC may be connected to external devices via the various connecting means.

In addition, the cap TS includes a black matrix BM disposed at the non-display area and a color filter CF disposed at the display area, on the inner side of the cap TS. Especially, in the case that the organic light emission layer OL generates the white light, the full color including red(R)-green(G)-blue(B) colors can be represented by using the color filter CF.

For the organic light emitting diode display having such a structure mentioned above, the cathode electrode CAT supplied with the reference voltage is deposited over the whole surface of the substrate for the display panel. When the cathode electrode CAT is made of metal material having relatively lower resistance, there is no problem. When the cathode electrode CAT is made of a transparent conductive material for ensuring enough transmittivity, the surface resistance of the cathode electrode CAT is high so this may cause degradation of the video quality.

For examples, when the cathode electrode CAT includes a transparent conductive material such as the indium-tin-oxide or the indium-zinc-oxide having higher resistivity (or, specific resistance) than metal materials, the surface resistance of the cathode electrode CAT is relatively high. As a result, the cathode electrode CAT may not have even voltage distribution over the whole surface of the display panel. This may cause the unevenness of the brightness or luminance of the display panel. Especially, as the area of the organic light emitting diode display is getting larger, the unevenness of the luminance or lightness may be severely caused.

SUMMARY OF THE INVENTION

Accordingly, the present invention id directed to a large area organic light emitting diode display that substantially obviates one or more of the problems due to limitations and disadvantages of the related art.

An object of the present invention is to provide a large area organic light emitting diode display having an auxiliary cathode electrode for lowering the surface resistance of the cathode electrode.

Another object of the present invention is to provide a large area organic light emitting diode display further including a protective electrode for preventing the auxiliary electrode for lowering the resistance of the cathode electrode being damaged in the manufacturing process conducted after forming the cathode electrode.

Additional features and advantages of the invention will be set further in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purposed of the present invention, as embodied and broadly described, an organic light emitting diode display comprises a substrate including a display area defining a plurality of pixel areas in a matrix manner and a non-display area surrounding the display area; a thin film transistor disposed in each pixel area; an auxiliary cathode electrode disposed at the same layer with an element of the thin film transistor; a planar layer on the thin film transistor and the auxiliary cathode electrode; an anode electrode connected to the thin film transistor and disposed in each pixel area on the planar layer; an organic light emission layer disposed on the anode electrode; a cathode electrode covering the whole surface of the display area on the organic light emission layer; and a protective electrode covering the auxiliary cathode electrode exposed through a cathode contact hole and contacting the cathode electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
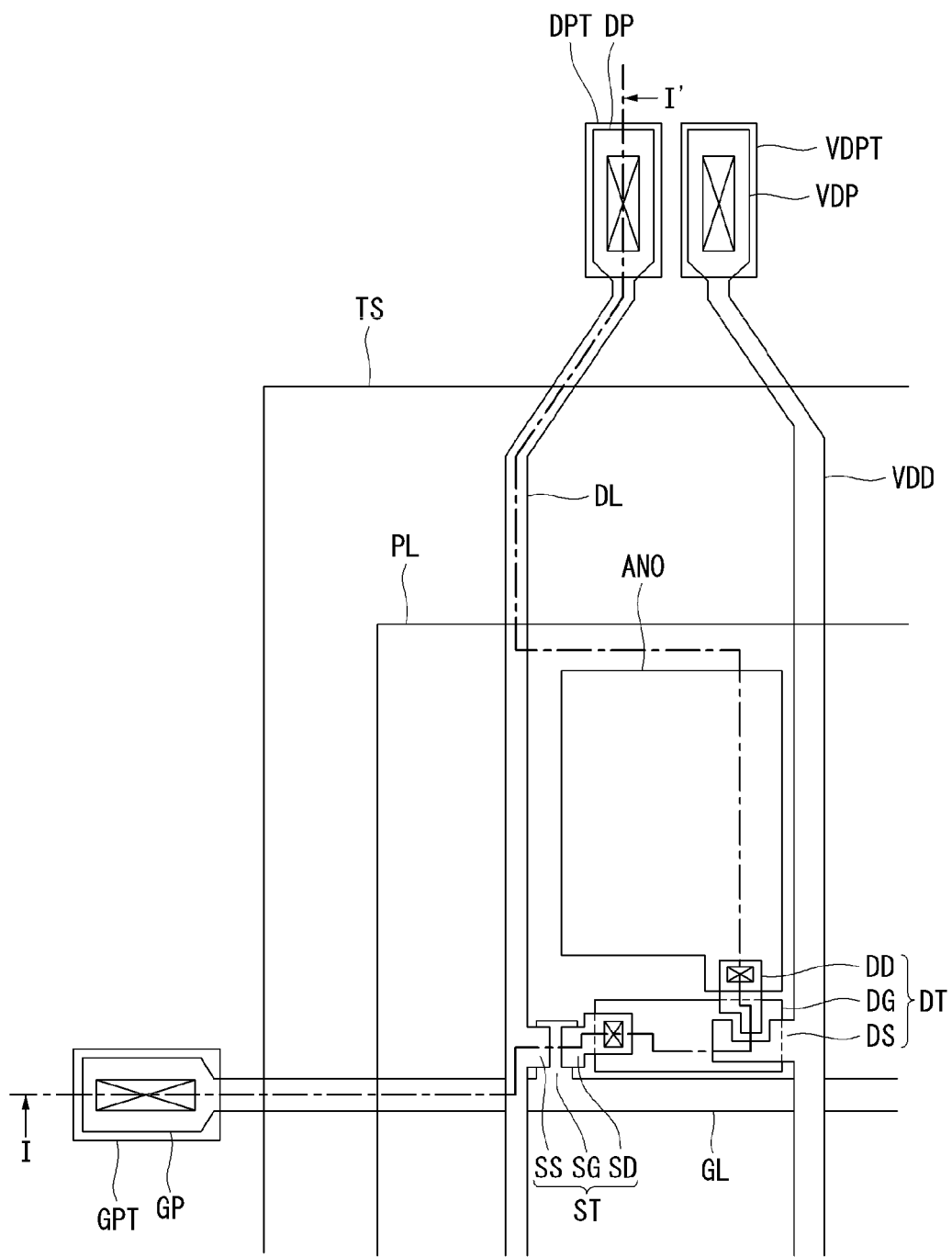
FIG. 1 is a plane view illustrating the structure of the organic light emitting diode display having the active switching elements such as the thin film transistors according to the related art.
Figure 2:
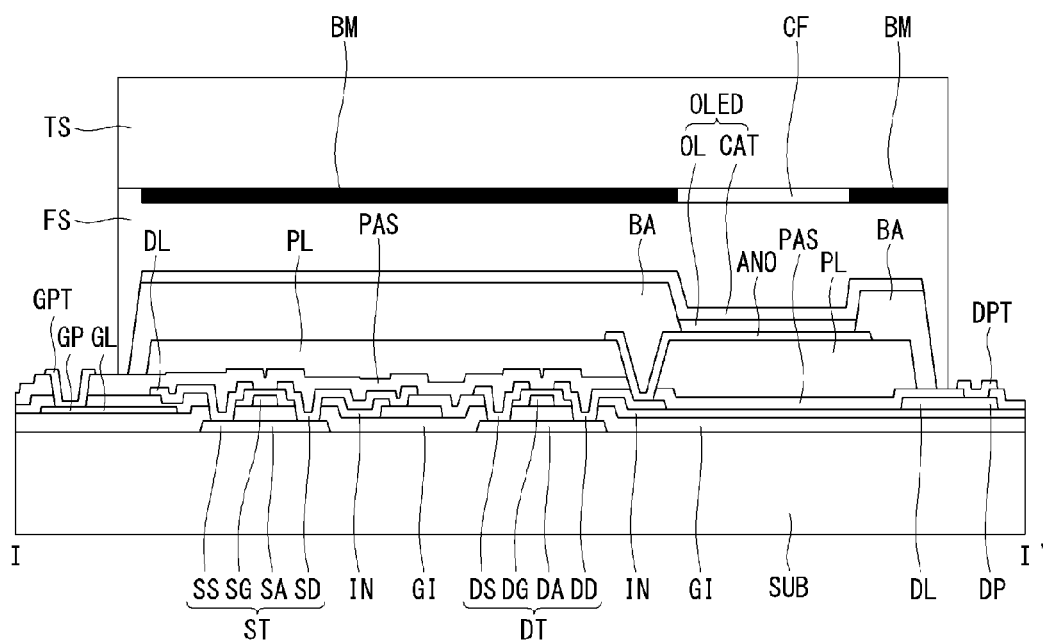
FIG. 2 is a cross sectional view illustrating the structure of the organic light emitting diode display along to the cutting line of I-I' in FIG. 1 according to the related art.

Referring to attached figures, we will explain preferred embodiments of the present disclosure. Like reference numerals designate like elements throughout the detailed description. However, the present disclosure is not restricted by these embodiments but can be applied to various changes or modifications without changing the technical spirit. In the following embodiments, the names of the elements are selected by considering the easiness for explanation so that they may be different from actual names.

Figure 3:
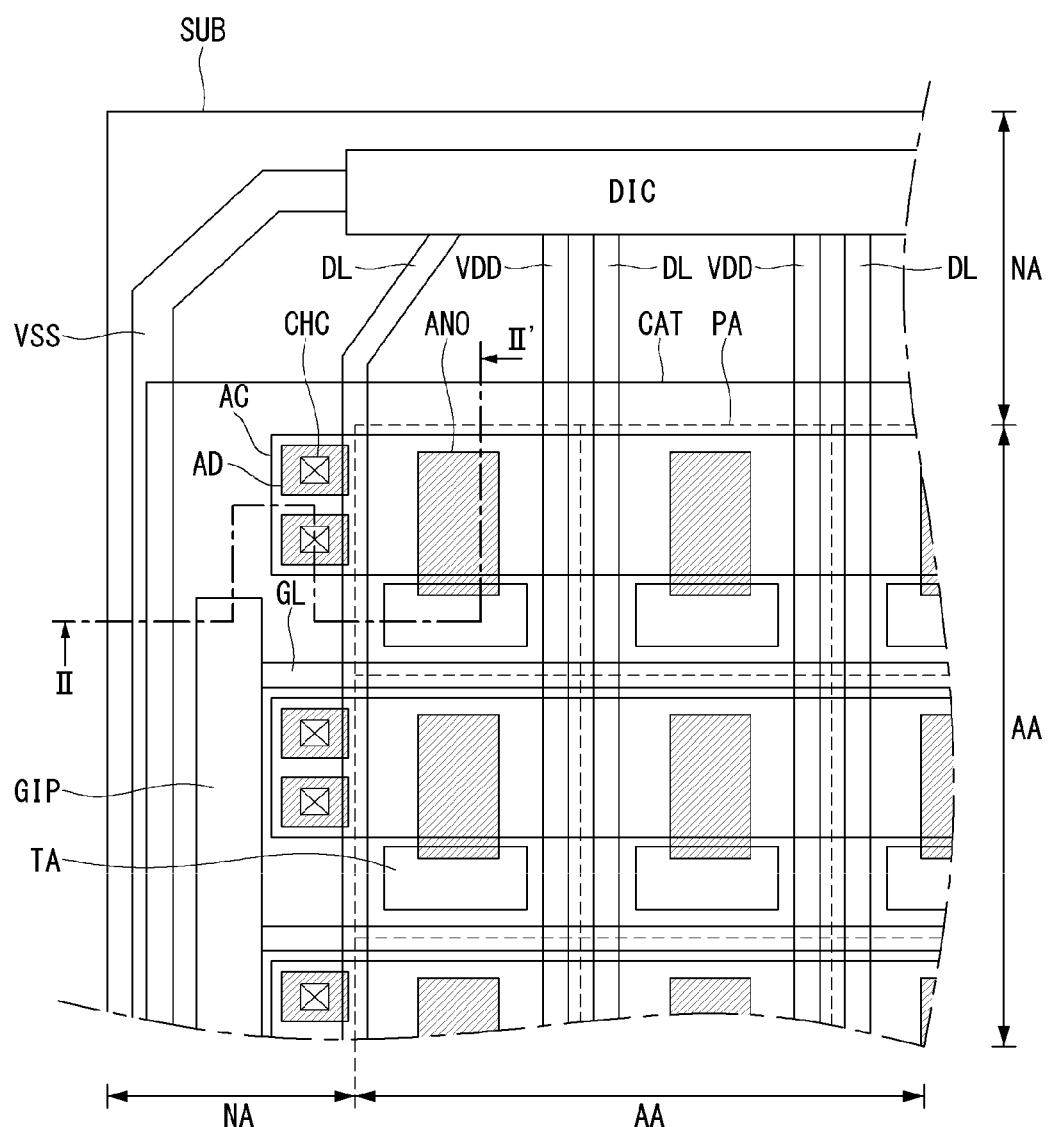
FIG. 3 is an enlarged plane view illustrating a structure of an organic light emitting diode display according to the first embodiment of the present disclosure.
Figure 4:
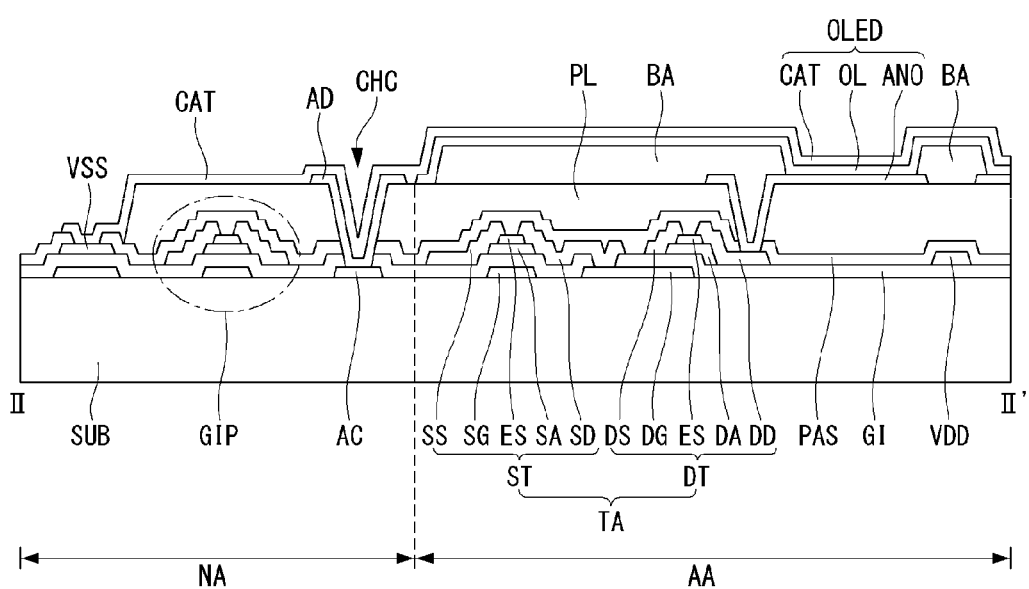
FIG. 4 is a cross sectional view illustrating a structure of the organic light emitting diode display along to the cutting line of II-II' in FIG. 3, according to the first embodiment of the present disclosure.

FIG. 3 is an enlarged plane view illustrating a structure of an organic light emitting diode display according to the first embodiment of the present disclosure. FIG. 4 is a cross sectional view illustrating a structure of the organic light emitting diode display along to the cutting line of II-II' in FIG. 3, according to the first embodiment of the present disclosure.

Referring to FIGS. 3 and 4, we will explain about the first embodiment of the present disclosure. One of the main features of the present disclosure is at the structure of the auxiliary (or, assistance) cathode electrode for lowering the resistance of the cathode electrode. Therefore, we will not explain in detail about the thin film transistor and/or the organic light emitting diode having the similar structure of the related art.

At first, referring to FIG. 3, we will explain about the plane structure of the organic light emitting diode display according to the first embodiment in detail. An organic light emitting diode display according to the first embodiment of the present disclosure comprises a substrate SUB including a display area AA for representing the video information and a non-display area NA having various elements for driving the elements in the display area AA. In the display area AA, a plurality of pixel areas PA disposed in a matrix manner are defined. In FIG. 3, the pixel area PA is illustrated as the dotted line.

For example, the pixel areas PA can be defined as an N (row)×M (column) matrix. However, the disposed pattern is not restricted this manner, but it has various type. Each of the pixel area PA has the same size or the different size. With one unit pixel having three sub pixels including red (R), green (G) and blue (B) sub pixels, the unit pixels are regularly disposed. Explaining with the simplest structure, the pixel area PA can be defined by the crossing structure of a plurality of gate lines GL running to horizontal direction and a plurality of data lines DL running to vertical direction.

In the non-display area NA defined as the circumstance area surrounding the pixel area PA, a data driving integrated circuit DIC for supplying the video data to the data line DL and a gate driving integrated circuit GIP for supplying the scan signal to the gate line GL are disposed. For that case of higher resolution display panel than VGA panel in which more data lines DL and more driving current lines VDD are required, the data driving integrated circuit DIC may be externally installed from the substrate SUB, and data contact pads may be disposed on the substrate SUB instead of the data driving integrated circuit DIC.

In order to simply show the structure of the display, the gate driving integrated circuit GIP is formed on one side portion of the substrate SUB directly. The ground line Vss for supplying the ground voltage may be disposed at the outermost side of the substrate SUB. The ground line Vss is disposed as to receive the ground voltage from external device located out of the substrate SUB, and to supply the ground voltage to the data driving integrated circuit DIC and the gate driving integrated circuit GIP. For example, the ground line Vss may be linked to the data driving integrated circuit DIC disposed at the upper side of the substrate SUB and to the gate driving integrated circuit GIP disposed at the right side and/or left side of the substrate SUB so as to surround the substrate SUB.

At each pixel area PA, the main elements such as an organic light emitting diode and thin film transistors for driving the organic light emitting diode are disposed. The thin film transistor is formed at the thin film transistor area TA defined at one side of the pixel area PA. The organic light emitting diode includes an anode electrode ANO, a cathode electrode CAT and an organic light emission layer OL inserted between these two electrodes. The actual emission area is decided by the area of the organic light emission layer OL overlapping with the anode electrode ANO.

The anode electrode ANO is formed as to occupy some area of the pixel area PA and is connected to the thin film transistor formed in the thin film transistor area TA. The organic light emission layer OL is deposited on the anode electrode ANO. The cathode electrode CAT is deposited on the organic light emission layer OL so as to cover whole surface of the display area AA having the pixel areas PA.

The cathode electrode CAT may go over the gate driving integrated circuit GIP and contact the ground line Vss disposed at the outer side. So, the ground voltage can be supplied to the cathode electrode CAT through the ground line Vss. The cathode electrode CAT receives the ground voltage and the anode electrode ANO receives the voltage corresponding to the video data and then, by the voltage difference between the cathode electrode CAT and the anode electrode ANO, the organic light emission layer OL radiates the light to represent the video information.

The cathode electrode CAT may be made of a transparent conductive material such as the Indium-Tin-Oxide or the Indium-Zinc-Oxide. Theses transparent conductive materials have relatively high specific resistance than the metal materials. For the top emission type organic light emitting display, the anode electrode ANO may be made of the metal material having low resistance and high reflection, so there is no resistance problem. On the contrary, the cathode electrode CAT is made of the transparent conductive material for ensuring transmittivity of the light generated by the organic light emission layer OL.

Especially, for the large area top emission type, in order to lower the resistance of the cathode electrode CAT, the cathode electrode CAT would be made of the metal material having lower resistance such as silver, Ag. In that case, considering the light transmittivity of the cathode electrode CAT, it is preferable that the cathode electrode CAT is formed with thin thickness as possible. Even though the cathode electrode CAT is made of the silver having lower resistance, when its thickness is getting thinner and thinner and it covers larger area, the surface resistance of the large area sheet silver layer would be higher. Then, the ground voltage may not be maintained uniformly over the whole surface of the substrate SUB. For example, the difference of the ground voltages between the inlet side and the outlet side (the farthest side from the inlet side) of the ground voltage through the substrate SUB would be large so that the brightness of the display panel would not be uniformly distributed.

In order to prevent this problem, the present disclosure suggests a large area organic light emitting diode display including an auxiliary cathode electrode AC made of metal material having lower specific resistance. In the first embodiment of the present disclosure, we will explain about the display panel in which the auxiliary cathode electrode AC is formed at the same layer with the gate line GL. In this case, the auxiliary cathode electrode AC may have a plurality of segments disposed parallel with the gate line GL. The auxiliary cathode electrode AC may be contacted the cathode electrode CAT through a cathode contact hole CHC.

In order to lower the surface resistance effectively, it is preferable that the number of the cathode contact hole CHC would be large as possible. However, too much number of the cathode contact hole CHC may not be good, because the contact resistance may be increased. Therefore, it is important to select proper number of the cathode contact hole CHC. In FIG. 3 showing the first embodiment of the present disclosure, the cathode contact holes CHC are disposed at some portions of the outside of the display area AA. If required, a plurality of pixel area cathode contact hole may be further included in each pixel area AA.

For the case of the top emission type, the lights generated from the organic light emission layer OL radiates toward the cathode electrode CAT, so that the auxiliary cathode electrode AC may be formed as having a wide strip type as being overlapped with but not contact the anode electrode ANO thereunder. For the case of the bottom emission type, the auxiliary cathode electrode AC may be disposed as not being overlapped with the emission area but being parallel with the gate line GL and/or data line DL.

With the condition in which the auxiliary cathode electrode AC is exposed through the cathode contact hole CHC, a bank BN and the organic light emission layer OL are formed and/or deposited. During these processes, the exposed surface of the auxiliary cathode electrode AC may be damaged. Especially, when the auxiliary cathode electrode AC has the copper (Cu) material in order to ensure lower resistance, the surface contact property of the auxiliary cathode electrode AC may be degraded. As the result, the auxiliary cathode electrode AC may be peeled off, or the contact with the cathode electrode CAT may not be good and normal condition.

In order to prevent these problem, in the first embodiment of the present disclosure, the large area organic light emitting diode display further comprises a protective electrode AD covering the auxiliary cathode electrode AC exposed through the cathode contact hole CHC. Considering the manufacturing process, the protective electrode AD may be formed at the same layer and made of the same material with the anode electrode ANO.

Further referring to FIG. 4, we will explain about the cross-sectional structure of the organic light emitting diode display according to the first embodiment of the present disclosure, in detail. Here, in convenience, the thin film transistor has the bottom gate structure. However, the main feature of the first embodiment can be applied to the top gate structure also.

On the substrate SUB, a non-display area NA and a display area AA are defined. The non-display area NA includes the gate driving integrated circuit GIP and the ground line Vss are disposed. The display area AA includes a switching thin film transistor ST, a driving thin film transistor DT and an organic light emitting diode OLED are defined.

The gate driving integrated circuit GIP has thin film transistors which are formed when the switching thin film transistor ST and the driving thin film transistor DT are formed. The switching thin film transistor ST in the pixel area PA has a gate electrode SG, a gate insulating layer GI, a channel layer SA, a source electrode SS and a drain electrode SD. In addition, the driving thin film transistor DT has a gate electrode DG connected to the drain electrode SD of the switching thin film transistor ST, the gate insulating layer GI, a channel layer DA, a source electrode DS and a drain electrode DD.

On the thin film transistors ST and DT, a passivation layer PAS and a planar layer PL are sequentially deposited. On the planar layer PL, an anode electrode ANO having an isolation shape within the pixel area PA is formed. The anode electrode ANO connects to the drain electrode DD of the driving thin film transistor DT through the contact hole penetrating the passivation layer PAS and the planar layer PL.

On the substrate SUB having the anode electrode ANO, a bank BA is deposited for defining the emission area. By patterning the bank BA, the most center portions of the anode electrode ANO are exposed. At the same time, cathode contact holes CHC are formed in the non-display area NA for exposing some area of the auxiliary cathode electrode AC. On the exposed anode electrode ANO, an organic light emission layer OL is deposited. Depositing a transparent conductive material on the bank BA, the cathode electrode CAT is formed. The organic light emitting diode OLED including the anode electrode ANO, the organic light emission layer OL and the cathode electrode CAT is formed.

In addition, auxiliary cathode electrode AC is made of the same metal material used for the gate line GL and the gate electrodes SG and DG of the thin film transistors ST and DT, and at the same layer with the gate line GL and the gate electrodes SG and DG Especially, in the first embodiment, the auxiliary cathode electrode AC has a line shape parallel with the gate line GL. The auxiliary cathode electrode AC is for lowering the surface resistance of the cathode electrode CAT so that it should be electrically and physically connected to the cathode electrode CAT. Therefore, a plurality of cathode contact holes CHC exposing some portions of the auxiliary cathode electrode AC are formed by penetrating the gate insulating layer GI, the passivation layer PAS and the planar layer PL.

For the case of the top emission type, as the lights generated at the organic light emission layer OL do not radiate to the substrate SUB, the auxiliary cathode electrode AC can be disposed under the anode electrode ANO and it may be overlapped with the anode electrode ANO, further, it may be parallel with the gate line GL. For the cases of the bottom emission type and the both sides emission type, as the lights would radiate to the substrate SUB, the auxiliary cathode electrode AC would be preferably disposed as being parallel with the gate line GL, but not being overlapped with the anode electrode ANO, and not contacting with the gate line GL.

A protective electrode AD is made of the same material with the anode electrode ANO during forming the anode electrode ANO, as covering the cathode contact hole CHC. The protective electrode AD would preferably have an isolated shape not contacting the anode electrode ANO. As the protective electrode AD is for preventing the exposed surface of the auxiliary cathode electrode AC through the cathode contact hole CHC, it would preferably have larger size than the cathode contact hole CHC.

On the substrate SUB having the bank BA, the organic light emission layer OL is deposited. In the case that the organic light emission layer OL may generate the white lights, color filters CF may be further included for representing full color video information. In that case, the organic light emission layer OL would be preferably formed as covering the whole surface of the display area AA. In the first embodiment, the cathode contact hole CHC (for connecting the auxiliary cathode electrode AC to the cathode electrode CAT) and the protective electrode AD are disposed within the non-display area NA. Therefore, the organic light emission layer OL may be not deposited on the protective electrode AD.

On the substrate SUB having the organic light emission layer OL, the cathode electrode CAT is deposited. The cathode electrode CAT is expanded over the gate driving integrated circuit GIP so that it may cover the display area AA and the non-display area NA and contact the ground line Vss disposed at the outer circumstance of the substrate SUB. As the result, the ground (or, reference) voltage can be supplied to the cathode electrode CAT via the ground line Vss.

In addition, the ground line Vss may be formed at the same layer and made of the same material with the gate electrodes SG and DG. In that case, the cathode electrode CAT can be connected to the ground line Vss through the contact hole penetrating the passivation layer PAS and the gate insulating layer GI over the ground line Vss. Otherwise, the ground line Vss may be formed at the same layer and made of the same material with the source-drain electrodes SS-SD and DS-DD. In this case, the cathode electrode CAT can be connected to the ground line Vss through the contact hole penetrating the passivation layer PAS over the ground line Vss.

In the first embodiment, the cathode electrode CAT is connected to the auxiliary cathode electrode AC via the cathode contact hole CHC. For more detail, the auxiliary cathode electrode AC contacts the protective electrode AD through the cathode contact hole CHC and the cathode electrode CAT is directly contact the protective electrode AD. For the large area organic light emitting diode display, as the area of the cathode electrode CAT is getting larger, thanks to the auxiliary cathode electrode AC including the low resistance metal material, the ground voltage can be supplied to the cathode electrode CAT with the uniform voltage value over the whole surface of the cathode electrode CAT. Further, thanks to the protective electrode AD, even the case that the auxiliary cathode electrode AC has the copper material, the surface stability of the auxiliary cathode electrode AC exposed through the cathode contact hole CHC can be ensured.

In the above explained first embodiment, the auxiliary cathode electrode AC is formed at the same layer with the gate line GL. In the following second embodiment, we will explain about the case that the auxiliary cathode electrode AC is formed at the same layer with the source-drain electrodes.

Figure 5:
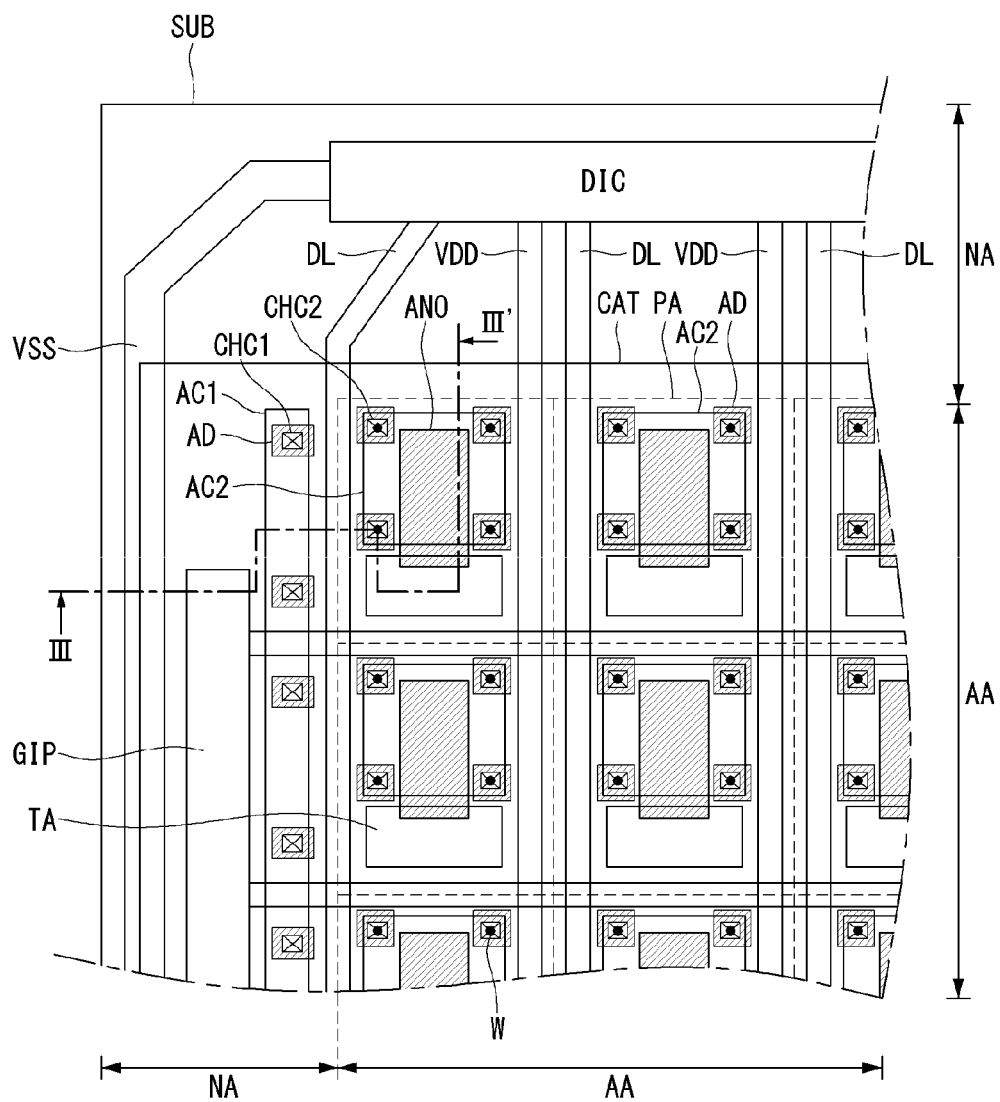
FIG. 5 is an enlarged plane view illustrating a structure of an organic light emitting diode display according to the second embodiment of the present disclosure.
Figure 6A:
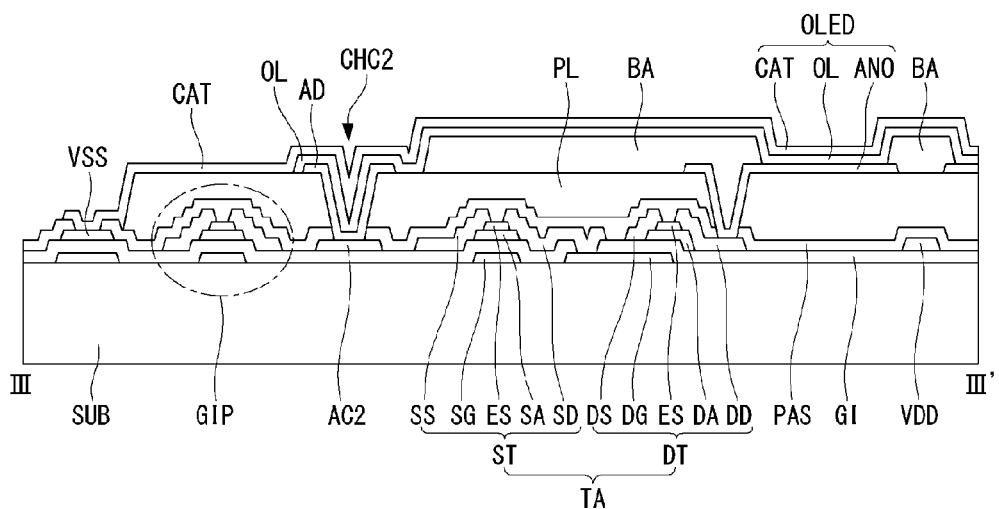
FIG. 6A is a cross sectional view illustrating a structure of the organic light emitting diode display along to the cutting line of III-III' in FIG. 5, according to the first embodiment of the present disclosure.
Figure 6B:
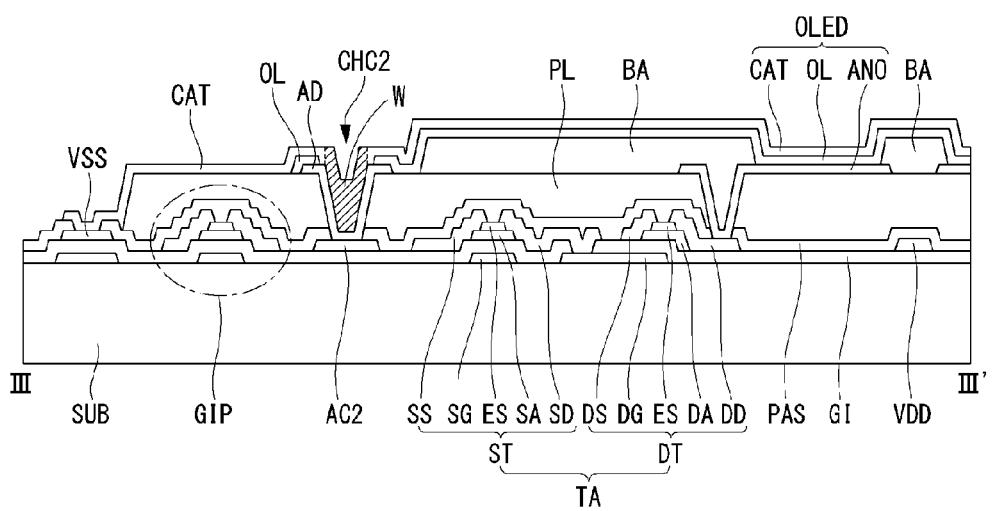
FIG. 6B is a cross sectional view illustrating a welding point for electrically connecting the stack of an auxiliary cathode electrode, a protective electrode and a cathode electrode at a cathode contact hole.

FIG. 5 is an enlarged plane view illustrating a structure of an organic light emitting diode display according to the second embodiment of the present disclosure. FIG. 6A is a cross sectional view illustrating a structure of the organic light emitting diode display along to the cutting line of III-III' in FIG. 5, according to the first embodiment of the present disclosure. FIG. 6B is a cross sectional view illustrating a welding point for electrically connecting the stack of an auxiliary cathode electrode, a protective electrode and a cathode electrode at a cathode contact hole.

The organic light emitting diode display according to the second embodiment of the present disclosure has very similar structure with the first embodiment. The difference is on that the auxiliary cathode electrode is formed at the same layer and made of the same material with the source-drain electrodes. Hereinafter, we will explain by focusing on the differences, mainly.

Referring to FIGS. 5, 6A and 6B, an organic light emitting diode display according to the second embodiment of the present disclosure comprises a substrate SUB including a non-display area NA and a display area AA. In the non-display area, a gate driving integrated circuit GIP and a ground line Vss are disposed. In the display area, a switching thin film transistor ST, a driving thin film transistor DT and an organic light emitting diode OLED are disposed.

The gate driving integrated circuit GIP may include thin film transistors formed when the switching thin film transistor ST and the driving thin film transistor DT in the display area AA. The switching thin film transistor ST in the pixel area PA has a gate electrode SG, a gate insulating layer GI, a channel layer SA, a source electrode SS and a drain electrode SD. In addition, the driving thin film transistor DT has a gate electrode DG connected to the drain electrode SD of the switching thin film transistor ST, the gate insulating layer GI, a channel layer DA, a source electrode DS and a drain electrode DD.

On the thin film transistors ST and DT, a passivation layer PAS and a planar layer PL are sequentially deposited. On the planar layer PL, an anode electrode ANO having an isolation shape within the pixel area PA is formed. The anode electrode ANO connects to the drain electrode DD of the driving thin film transistor DT through the contact hole penetrating the passivation layer PAS and the planar layer PL.

On the substrate SUB having the anode electrode ANO, a bank BA is deposited for defining the emission area. By patterning the bank BA, the most center portions of the anode electrode ANO are exposed. At the same time, cathode contact holes CHC are formed in the non-display area NA for exposing some area of the auxiliary cathode electrode AC. On the exposed anode electrode ANO, an organic light emission layer OL is deposited. Depositing a transparent conductive material on the bank BA, the cathode electrode CAT is formed. The organic light emitting diode OLED including the anode electrode ANO, the organic light emission layer OL and the cathode electrode CAT is formed.

In addition, the auxiliary cathode electrode AC is made of the same metal material and is disposed at the same layer with the source-drain electrodes SS-SD and DS-DD. Especially, in the second embodiment, the auxiliary cathode electrode AC has a line shape parallel with the data line DL or the driving current line VDD between them. The auxiliary cathode electrode AC is for lowering the surface resistance of the cathode electrode CAT so that it should be electrically and physically connected to the cathode electrode CAT. Therefore, a plurality of cathode contact holes CHC exposing some portions of the auxiliary cathode electrode AC are formed by penetrating the passivation layer PAS and the planar layer PL.

For the case of the top emission type, as the lights generated at the organic light emission layer OL do not radiate to the substrate SUB, the auxiliary cathode electrode AC can be disposed under the anode electrode ANO and it may be overlapped with the anode electrode ANO with similar shape of the anode electrode ANO. For the cases of the bottom emission type and the both sides emission type, as the lights would radiate to the substrate SUB, the auxiliary cathode electrode AC would be preferably disposed as being parallel with the data line DL or the driving current line VDD, but not being overlapped with the anode electrode ANO.

In the second embodiment, a first auxiliary cathode electrode AC1 is disposed between the display area AA and the gate driving integrated circuit GIP and parallel with the data line DL. Further, a second auxiliary cathode electrode AC2 is disposed within the pixel area PA in the display area AA as being an isolation shape overlapping with the anode electrode ANO. As shown in FIG. 5, as the drain electrodes SD in the thin film transistor area TA may be disposed as being parallel with the gate line GL, the second auxiliary cathode electrode AC2 may have a small rectangular shape isolated within each pixel area PA. However, the second auxiliary cathode electrode AC2 may have a line shape parallel with the data line DL and the driving current line VDD covering the column pixel areas PA.

A protective electrode AD is made of the same material with the anode electrode ANO during forming the anode electrode ANO, as covering the cathode contact hole CHC. The protective electrode AD would preferably have an isolated shape not contacting the anode electrode ANO. As the protective electrode AD is for preventing the exposed surface of the first and second auxiliary cathode electrodes AC1 and AC2 through the cathode contact hole CHC, they would preferably have larger size than the cathode contact hole CHC.

On the substrate SUB having the bank BA, the organic light emission layer OL is deposited. In the case that the organic light emission layer OL may generate the white lights, color filters CF may be further included for representing full color video information. In that case, the organic light emission layer OL would be preferably formed as covering the whole surface of the display area AA. In the second embodiment, the first cathode contact hole CHC1 (for connecting the first auxiliary cathode electrode AC1 to the cathode electrode CAT) and the protective electrode AD (for covering the first cathode contact hole CHC1) are disposed within the non-display area NA. Further, the second cathode contact hole CHC2 (for connecting the second auxiliary cathode electrode AC2 to the cathode electrode CAT) and the protective electrode AD (for covering the second cathode contact hole CHC2) are disposed within the display area AA, especially within the pixel area PA.

On the protective electrode AD disposed over the first auxiliary cathode electrode AC1, there may be or not be the organic light emission layer OL. However, on the protective electrode AD disposed over the second auxiliary cathode electrode AC2, the organic light emission layer OL should be deposited. Therefore, in explanation for the second embodiment, the organic light emission layer OL would be deposited on the protective electrode AD.

On the substrate SUB having the organic light emission layer OL, the cathode electrode CAT is deposited. The cathode electrode CAT is expanded over the gate driving integrated circuit GIP so that it may cover the display area AA and the non-display area NA and contact the ground line Vss disposed at the outer circumstance of the substrate SUB. As the result, the ground (or, reference) voltage can be supplied to the cathode electrode CAT via the ground line Vss.

In addition, the ground line Vss may be formed at the same layer and made of the same material with the gate electrodes SG and DG. In that case, the cathode electrode CAT can be connected to the ground line Vss through the contact hole penetrating the passivation layer PAS and the gate insulating layer GI over the ground line Vss. Otherwise, the ground line Vss may be formed at the same layer and made of the same material with the source-drain electrodes SS-SD and DS-DD. In this case, the cathode electrode CAT can be connected to the ground line Vss through the contact hole penetrating the passivation layer PAS over the ground line Vss.

In the second embodiment, the cathode electrode CAT is connected to the first and second auxiliary cathode electrodes AC1 and AC2 via the first and second cathode contact holes CHC1 and CHC2, respectively. For more detail, the first and second auxiliary cathode electrodes AC1 and AC2 contact the protective electrode AD through the first and second cathode contact holes CHC1 and CHC2, respectively, and the cathode electrode CAT is directly contact the protective electrode AD. For the large area organic light emitting diode display, as the area of the cathode electrode CAT is getting larger, thanks to the first and second auxiliary cathode electrodes AC1 and AC2 including the low resistance metal materials, the ground voltage can be supplied to the cathode electrode CAT with the uniform voltage value over the whole surface of the cathode electrode CAT. Further, thanks to the protective electrode AD, even the case that the first and second auxiliary cathode electrodes AC1 and AC2 have the copper materials, the surface stability of the first and second auxiliary cathode electrodes AC1 and AC2 exposed through the first and second cathode contact holes CHC1 and CHC2 can be ensured.

The protective electrode AD formed in the pixel area PA can protect the second auxiliary cathode electrode AC2 exposed through the second cathode contact hole CHC2. Further, on this protective electrode AD, the organic light emission layer OL is deposited and the cathode electrode CAT is deposited thereon. That is, in the display area AA, the organic light emission layer OL is inserted between the protective electrode AD and the cathode electrode CAT.

In this case, the protective electrode AD and the cathode electrode CAT may not be electrically contacted, so that the second auxiliary cathode electrode AC2 may be not working as lowering the surface resistance of the cathode electrode CAT. To solve this problem, as shown in FIG. 6B, a welding point W is formed by applying a LASER welding process on the second cathode contact hole CHC2 disposed within the display area AA, so that the cathode electrode CAT, the protective electrode AD and the second auxiliary cathode electrode AC2 can be electrically connected. By doing so, at the welding point W, the organic emission layer OL may be partially melted. At the same time, the cathode electrode CAT, the protective electrode AD and the second auxiliary cathode electrode AC2 are melted and mixed. That is, the welding point W would be the electrical contacting point of the cathode electrode CAT and the second auxiliary cathode electrode AC2.

Hereinafter, referring to FIGS. 7 and 8, we will explain about the third embodiment of the present disclosure. The third embodiment is for the case in which the protective electrode works as the protective electrode and as the auxiliary cathode electrode, by forming it to have the maximum size as possible. In convenience, we will explain about the case in which the auxiliary cathode electrode is formed at the same layer with the gate elements (gate electrode and/or gate line), as mentioned in the first embodiment. However, the main idea of the third embodiment can be applied to the second embodiment of the present disclosure.

Figure 7:
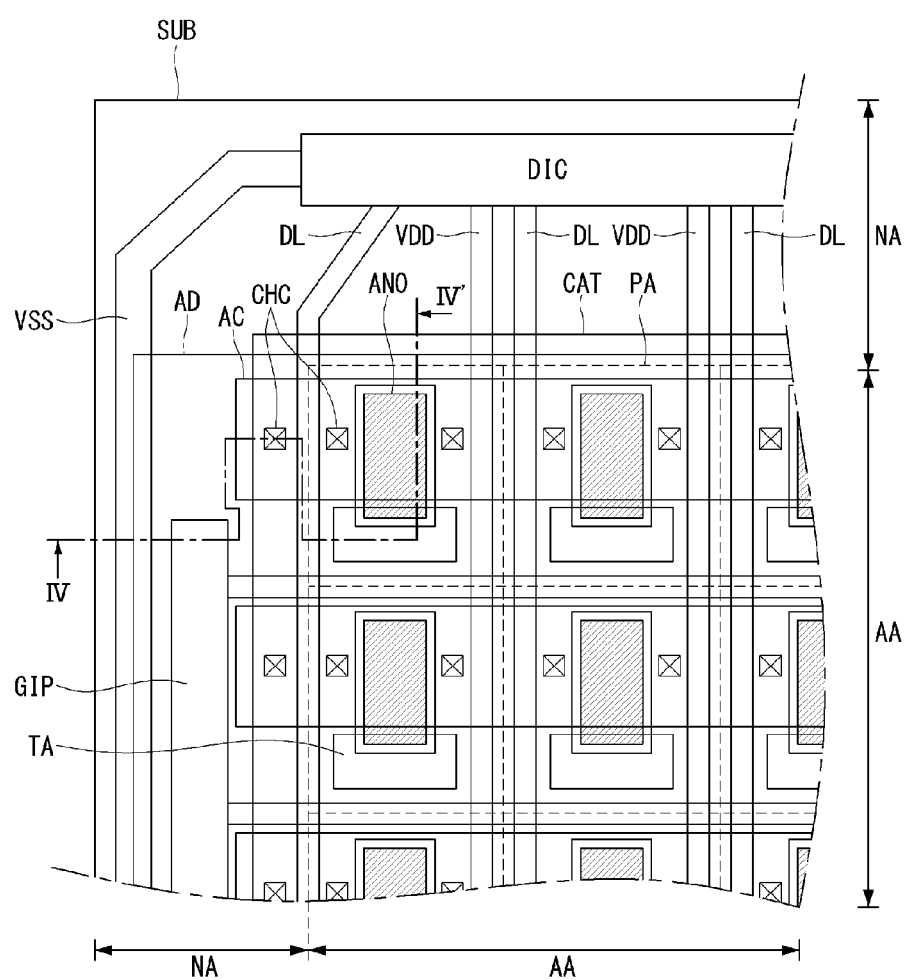
FIG. 7 is an enlarged plane view illustrating a structure of an organic light emitting diode display according to the third embodiment of the present disclosure.

FIG. 7 is an enlarged plane view illustrating a structure of an organic light emitting diode display according to the third embodiment of the present disclosure. FIG. 8 is a cross sectional view illustrating a structure of the organic light emitting diode display along to the cutting line of IV-IV' in FIG. 7, according to the first embodiment of the present disclosure.

In the third embodiment, the auxiliary cathode electrode AC is formed at the same layer with the gate line GL. For example, it has the same structure with the auxiliary cathode electrode as explained in the first embodiment. That is, the structures of the thin film transistors ST and DT and the auxiliary cathode electrode AC are the same with those of the first embodiment. The differences are on the structures and the connection relationships of the cathode electrode CAT and the protective electrode AD.

The organic light emitting diode display according to the third embodiment of the present disclosure comprises a substrate SUB including a display area AA and a non-display area NA. The display area AA includes elements for representing the video information and the non-display area NA includes various elements for driving the elements in the display area AA. In the display area AA, a plurality of pixel areas PA are defined as arraying in a matrix manner.

In each pixel area PA, an organic light emitting diode OLED and thin film transistors ST and DT driving the organic light emitting diode OLED are disposed. The thin film transistors ST and DT are disposed within the thin film transistor area TA defined at one side of the pixel area PA. The organic light emitting diode OLED includes an anode electrode ANO, a cathode electrode CAT and an organic light emission layer OL inserted between these two electrodes. The actual emission area is decided by the overlapped area of the organic light emission layer OL with the anode electrode ANO.

The anode electrode ANO is formed as occupying some area of the pixel area PA and is connected to the thin film transistor disposed in the thin film transistor area TA. On the anode electrode ANO, the organic light emission layer OL would be deposited. The cathode electrode CAT may be deposited on the organic light emission layer OL as one layer body covering the surfaces of the display area AA including all of the pixel areas PA.

The cathode electrode CAT may include a transparent conductive material such as Indium Tin Oxide or Indium Zinc Oxide. These transparent conductive materials have larger specific resistance than the metal materials. For the top emission type organic light emitting diode display, the anode electrode ANO may be made of the metal material having low resistance and high reflection, so there is no resistance problem. On the contrary, the cathode electrode CAT is made of the transparent conductive material for ensuring transmittivity of the light generated by the organic light emission layer OL.

Especially, for the large area top emission type, in order to lower the resistance of the cathode electrode CAT, the cathode electrode CAT would be made of the metal material having lower resistance such as silver, Ag. In that case, considering the light transmittivity of the cathode electrode CAT, it is preferable that the cathode electrode CAT is formed with thin thickness as possible. Even though the cathode electrode CAT is made of the silver having lower resistance, when its thickness is getting thinner and thinner and it covers larger area, the surface resistance of the large area sheet silver layer would be higher. Then, the ground voltage may not be maintained uniformly over the whole surface of the substrate SUB.

In order to prevent this problem, the present disclosure suggests a large area organic light emitting diode display including an auxiliary cathode electrode AC made of metal material having lower specific resistance. In the third embodiment of the present disclosure, as explained in the first embodiment, we will explain about the display panel in which the auxiliary cathode electrode AC is formed at the same layer with the gate line GL. In this case, the auxiliary cathode electrode AC may have a plurality of segments disposed parallel with the gate line GL. The auxiliary cathode electrode AC may be contacted the cathode electrode CAT through a cathode contact hole CHC.

In order to lower the surface resistance effectively, it is preferable that the number of the cathode contact hole CHC would be large as possible. However, too much number of the cathode contact hole CHC may not be good, because the contact resistance may be increased. Therefore, it is important to select proper number of the cathode contact hole CHC. In FIG. 7 showing the third embodiment of the present disclosure, the cathode contact holes CHC are disposed at some portions of the outside of the display area AA and some portions within the pixel area PA.

For the case of the top emission type, the lights generated from the organic light emission layer OL radiates toward the cathode electrode CAT, so that the auxiliary cathode electrode AC may be formed as having a wide strip type as being overlapped with but not contact the anode electrode ANO thereunder. For the case of the bottom emission type, the auxiliary cathode electrode AC may be disposed as not being overlapped with the emission area but being parallel with the gate line GL and/or data line DL.

With the condition in which the auxiliary cathode electrode AC is exposed through the cathode contact hole CHC, a bank BN and the organic light emission layer OL are formed and/or deposited. During these processes, the exposed surface of the auxiliary cathode electrode AC may be damaged. Especially, when the auxiliary cathode electrode AC has the copper (Cu) material in order to ensure lower resistance, the surface contact property of the auxiliary cathode electrode AC may be degraded. As the result, the auxiliary cathode electrode AC may be peeled off, or the contact with the cathode electrode CAT may not be good and normal condition.

In order to prevent these problem, in the third embodiment of the present disclosure, the large area organic light emitting diode display further comprises a protective electrode AD covering the auxiliary cathode electrode AC exposed through the cathode contact hole CHC. Considering the manufacturing process, the protective electrode AD may be formed at the same layer and made of the same material with the anode electrode ANO.

Especially, in the third embodiment, the protective electrode AD expanded as covering the gate driving integrated circuit GIP and is connected to the ground line Vss disposed at outer circumstance of the substrate SUB. As the protective electrode AD includes the same material with the anode electrode ANO, the resistance of the protective electrode AD may be lower than the cathode electrode CAT. Therefore, it is prefer for the ground voltage to be supplied to the protective electrode AD from the ground ling Vss, directly. That is, the ground voltage supplied from the ground line Vss is send to the cathode electrode CAT through the protective electrode AD. Supplying the ground voltage to the cathode electrode CAT and supplying the data voltage to the anode electrode ANO, by the voltage differences between them, the organic light emission layer OL generates the lights corresponding to the video information.

For more detail, the protective electrode AD is formed by depositing the silver material and the transparent conductive material over all surface of the substrate SUB and patterning them. The protective electrode AD covers all of the pixel area PA and expands over the gate driving integrated circuit GIP to contact the ground line Vss. At the same time, the anode electrode ANO is formed as having an isolation shape corresponding to the emission area defined in each pixel area. The anode electrode ANO is apart from the protective electrode AD with a predetermined distance so it is electrically and physically isolated from the protective electrode AD.

Figure 8:
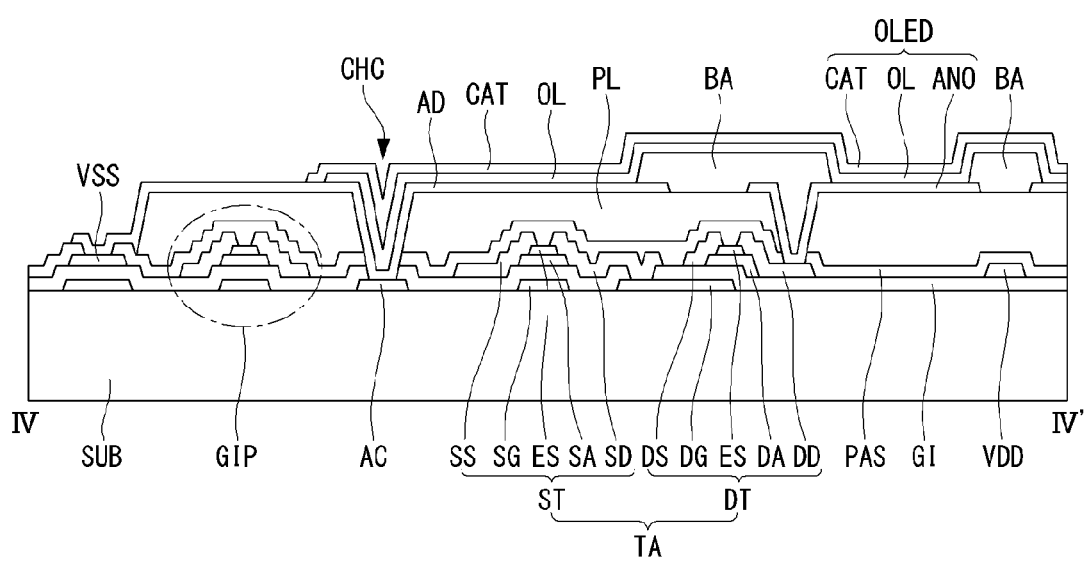
FIG. 8 is a cross sectional view illustrating a structure of the organic light emitting diode display along to the cutting line of IV-IV' in FIG. 7, according to the first embodiment of the present disclosure.

Further referring to FIG. 8, we will explain about the cross-sectional structure of the organic light emitting diode display according to the third embodiment of the present disclosure. On the substrate SUB, the non-display area NA and the display area AA are defined. In the non-display area NA, the gate driving integrated circuit GIP and the ground line Vss are disposed. In the display area AA, the switching thin film transistor ST, the driving thin film transistor DT and the organic light emitting diode OLED are disposed.

The switching thin film transistor ST in the pixel area PA has a gate electrode SG, a gate insulating layer GI, a channel layer SA, a source electrode SS and a drain electrode SD. In addition, the driving thin film transistor DT has a gate electrode DG connected to the drain electrode SD of the switching thin film transistor ST, the gate insulating layer GI, a channel layer DA, a source electrode DS and a drain electrode DD.

On the thin film transistors ST and DT, a passivation layer PAS and a planar layer PL are sequentially deposited. On the planar layer PL, an anode electrode ANO having an isolation shape within the pixel area PA is formed. The anode electrode ANO connects to the drain electrode DD of the driving thin film transistor DT through the contact hole penetrating the passivation layer PAS and the planar layer PL.

In addition, with the same material of the anode electrode ANO, the protective electrode AD is formed as apart from the anode electrode ANO with a predetermined distance. The protective electrode AD covers all area of the pixel area PA on the planar layer PL. Further, the protective electrode AD is expanded over the planar layer PL covering the gate driving integrated circuit GIP to contact the ground line Vss.

Especially, the protective electrode AD is electrically and physically connected to the auxiliary cathode electrode AC through the cathode contact hole CHC exposing the auxiliary cathode electrode penetrating the planar layer PL, the passivation layer PAS and the gate insulating layer GI. The protective electrode AD may prevent the exposed surface of the auxiliary cathode electrode AC exposed via the cathode contact hole CHC from being damaged or having surface contact failure.

The ground line Vss may be formed at the same layer and be made of the same material with the gate electrodes SG and DG In this case, the ground line Vss may contact the protective electrode AD through the contact hole penetrating the passivation layer PAS and the gate insulating layer GI on the ground line Vss. Otherwise, the ground line Vss may be formed at the same layer and made of the same material with the source-drain electrodes SS-SD and DS-DD. In that case, the ground line Vss can be connected to the protective electrode AD through the contact hole penetrating the passivation layer PAS and the gate insulating layer GI over the ground line Vss.

On the anode electrode ANO and the protective electrode AD, a bank BA is deposited. Patterning the bank BA, most of the anode electrode ANO is exposed. On the exposed anode electrode ANO by the bank BA, the organic light emission layer OL is deposited. Depositing a transparent conductive material on the bank BA and the anode electrode ANO, the cathode electrode CAT is formed. Expanding out of the display area AA, the cathode electrode CAT may contact to the protective electrode AD exposed by not being covered by the bank BA. Therefore, the organic light emitting diode OLED including the anode electrode ANO, the organic light emission layer OL and the cathode electrode CAT is completed.

The ground voltage is supplied to the protective electrode AD through the ground line Vss and then supplied to the cathode electrode CAT. Especially, for the large area organic light emitting diode display, thanks to the auxiliary cathode electrode AC having the same low resistance metal material with the gate line GL and the protective electrode AD including silver material and having the large area as the cathode electrode CAT, the surface resistance of the cathode electrode CAT would be in lower condition. The ground voltage can be supplied to the cathode electrode CAT with the uniform voltage value over the whole surface of the cathode electrode CAT.

In the FIGS. 7 and 8 showing the third embodiment of the present disclosure, in convenience, the welding point is not shown. However, if required, by conducting welding process on the cathode contact hole CHC where the protective electrode AD, the auxiliary cathode electrode AC and the organic light emission layer OL are stacked, the cathode electrode CAT can be electrically and/or physically contacted the protective electrode AD. That is, the welding point (not shown in the figures), as the electrical contacting point of the cathode electrode CAT and the protective electrode AD and as the melting point of the organic light emission layer OL, may be further formed.

The organic light emitting diode display device according to the present disclosure comprises an auxiliary cathode electrode connected to the cathode electrode and made of the same material for the gate element or the source-drain element, such as copper. Therefore, the cathode electrode can have lower surface resistance enough to have uniformed brightness distribution over the whole surface of the large area organic light emitting diode display panel. Further comprising a protective electrode between the cathode electrode and the auxiliary cathode electrode, the auxiliary cathode electrode can be prevented from being peeled off or having bad contact with the cathode electrode. According to the present disclosure, in a large area organic light emitting diode display, the reference voltage can be supplied uniformly over the whole surface of the cathode electrode.

While example embodiments of the present invention have been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention

What is claimed is:

1. An organic light emitting diode display, comprising:
   a substrate including a display area defining a plurality of pixel areas in a matrix manner and a non-display area surrounding the display area;
   a thin film transistor disposed in each pixel area;
   an auxiliary cathode electrode disposed at the same layer with an element of the thin film transistor, and covering the display area and the non-display area;
   a planar layer on the thin film transistor and the auxiliary cathode electrode;
   an anode electrode connected to the thin film transistor and disposed in each pixel area on the planar layer;
   an organic light emission layer disposed on the anode electrode;
   a cathode electrode covering the whole surface of the display area on the organic light emission layer;
   a protective electrode covering the auxiliary cathode electrode exposed through a cathode contact hole and contacting the cathode electrode,
   wherein the cathode contact hole includes a first cathode contact hole exposing some portions of the auxiliary cathode electrode disposed in the non-display area, and a second cathode contact hole exposing some portions of the auxiliary cathode electrode disposed in the display area;
   wherein the organic light emission layer and the cathode electrode are stacked on the protective electrode covering the auxiliary cathode electrode exposed by the second cathode contact hole; and
   wherein the protective electrode covers an exposed surface of the auxiliary cathode electrode through the first and the second cathode contact holes; and
   a welding point electrically connecting the protective electrode, the cathode electrode, and the auxiliary cathode electrode at the second cathode contact hole.

2. The device according to the claim 1, wherein the protective electrode includes the same material with the anode electrode.

3. The device according to the claim 1, further comprising a ground line disposed at the outer circumstance of the substrate at the non-display area,
   wherein the cathode electrode expands to the non-display area and contacts the ground line.

4. The device according to the claim 1, wherein the thin film transistor includes:
   a gate element formed on the substrate;
   a gate insulating layer covering the gate element; and
   a source-drain element overlapping with some portions of the gate element on the gate insulating layer, and covered by the planar layer,
   wherein the auxiliary cathode electrode is disposed at the same layer and includes the same material with any one of the gate element and the source-drain element.

5. The device according to the claim 1, further comprising a welding point electrically connecting the cathode electrode to the protective electrode.

6. The device according to the claim 1, wherein the auxiliary cathode electrode includes:
   a metal layer having a copper material; and
   a conductive layer stacked with the metal layer.

7. An organic light emitting diode display, comprising:
   a substrate including a display area defining a plurality of pixel areas in a matrix manner and a non-display area surrounding the display area;
   a thin film transistor disposed in each pixel area;
   an auxiliary cathode electrode disposed at the same layer with an element of the thin film transistor;
   a planar layer on the thin film transistor and the auxiliary cathode electrode;
   an anode electrode connected to the thin film transistor and disposed in each pixel area on the planar layer;
   an organic light emission layer disposed on the anode electrode;
   a cathode electrode covering the whole surface of the display area on the organic light emission layer;
   a protective electrode covering the auxiliary cathode electrode exposed through a cathode contact hole and contacting the cathode electrode; and
   a ground line disposed at the outer circumstance of the substrate at the non-display area, wherein the protective electrode disposed apart from the anode electrode with a predetermined distance expands to the non-display area and contacts the ground line.

* * * * *